United States Patent [19]
Garrett et al.

[11] Patent Number: 5,422,785
[45] Date of Patent: Jun. 6, 1995

[54] BOTTOM ACTUATED FORCE MULTIPLYING CARD EJECTOR APPARATUS FOR A COMPUTER

[75] Inventors: Robert Garrett; Greg Ellis; Erica Scholder; Pearce Jones, all of Austin, Tex.

[73] Assignee: Dell USA, L.P., Austin, Tex.

[21] Appl. No.: 139,473

[22] Filed: Oct. 19, 1993

[51] Int. Cl.$^6$ .......................... G06F 1/16; H05K 710; H01R 13/62
[52] U.S. Cl. .................................. 361/684; 361/754; 439/159
[58] Field of Search ............... 439/152, 157, 159, 160; 364/708.1; 361/684, 725, 727, 754, 798

[56] References Cited

U.S. PATENT DOCUMENTS 5,281,157  1/1994  Abe et al. ............................. 439/159
5,315,478  5/1994  Cadwell et al. ...................... 361/684

Primary Examiner—Michael W. Phillips
Attorney, Agent, or Firm—J. Richard Konneker; James W. Huffman

[57] ABSTRACT

A computer is provided with a pair of internal PCMCIA card connection chambers opening outwardly through a pair of housing side wall slots through which PCMCIA cards may be inserted into and withdrawn from the chambers. To facilitate the disconnection and withdrawal of the inserted cards each chamber is provided with a mechanically leveraged card ejector mechanism positioned within a thin space between the facing sides of the inserted card and a housing wall portion of the chamber, and disposed essentially entirely within the peripheral footprint of the inserted card. Each ejector mechanism includes a manually operable actuating plate slidably disposed on the outer side of the computer housing, a card receiving/ejection plate overlying the actuating plate within the housing, and a lever plate sandwiched between the actuating plate and receiving/ejection plate and pivotally connected to the housing. As a PCMCIA card is inserted into its chamber it engages and inwardly drives the receiving/ejection plate which in turn inwardly pivots the lever plate causing it to inwardly drive the actuating plate. The pivotally mounted lever plate is connected to the actuating plate and receiving/ejection plate in a manner such that when an outwardly directed manual ejection force is exerted on the actuating plate, to eject the inserted card, the lever plate transmits an amplified, outwardly directed ejection force to the card, via the receiving/ejection plate, to thereby substantially lessen the manual force required to eject the inserted card.

18 Claims, 6 Drawing Sheets

BOTTOM ACTUATED FORCE MULTIPLYING CARD EJECTOR APPARATUS FOR A COMPUTER

BACKGROUND OF THE INVENTION

The present invention generally relates to computer apparatus, and more particularly relates to PCMCIA card receiving and ejection apparatus disposed within a computer housing.

Computer cards, more specifically PCMCIA cards small expansion modules each roughly the size and shape of a credit card, are often used in conjunction with a computer to easily, rapidly and interchangeably add various operational capabilities to the computer such as additional memory, enhanced video characteristics, networking or a fax/modem. Typically, a PCMCIA card is insertable through an exterior housing side wall slot of the computer into an interior housing card chamber within which a socketed inner end of the inserted card is forcibly plugged into a complementary pin connector portion of the computer system planar board.

To later unplug and remove the inserted PCMCIA card an oppositely directed, essentially equal disconnection and removal force is required to draw the inserted card outwardly through its associated housing slot. Heretofore, two primary types of card ejector mechanism have been proposed to accomplish this card disconnection and withdrawal task.

The first type of card ejector mechanism, commonly referred to as a "bottom actuated" ejector, comprises a movable plate member which underlies the inserted PCMCIA card and may be manually pulled to engage the card, disconnect it from its associated planar board pin connector structure, and outwardly move an end portion of the disconnected card through its housing slot where it may be manually grasped and pulled to complete the removal of the card from the computer interior. While of a relatively simple design, this type of card ejector mechanism has the disadvantage of having no force amplification—i.e., each pound of card disconnection force requires that a pound of actuation force be manually exerted on the movable plate member.

The other type of ejector mechanism is positioned to one side of the inserted PCMCIA card, in generally the same plane therewith, and is operative to exert on the inserted card a disconnection force which is amplified relative to the manual actuation input force exerted on the ejector mechanism. While such force amplification is quite desirable, and substantially facilitates disconnection and removal of the inserted PCMCIA card, this type of ejector mechanism tends to be relatively complex and undesirably requires additional housing space outside the periphery of the inserted card to accommodate the ejector mechanism.

As can be readily seen from the foregoing it would be highly desirable to provide an improved force amplified type of PCMCIA card ejector mechanism which is of a simple, compact design. It is accordingly an object of the present invention to provide such an improved force amplified PCMCIA card ejector mechanism.

SUMMARY OF THE INVENTION

In carrying out principles of the present invention, in accordance with a preferred embodiment thereof, a computer is provided with a specially designed, mechanically leveraged PCMCIA card ejector mechanism that is very compactly disposed essentially entirely within the peripheral footprint of a PCMCIA card operatively inserted into the computer.

The computer, representatively a notebook computer, includes a housing having a first exterior wall with a card insertion slot therein, and an internal chamber opening outwardly through the slot and configured to receive a PCMCIA card removably inserted therein through the slot. An electrical connector structure, representatively carried on the main system planar board of the computer, is disposed within the housing and positioned to be operatively engaged by and coupled to the PCMCIA card in response to insertion of the card into the chamber.

The mechanically leveraged ejector mechanism is operative to facilitate the uncoupling of the inserted PCMCIA card from the electrical connector structure and the removal of the uncoupled card from the chamber through the housing insertion slot. The ejector mechanism includes a receiving/ejection member; an actuating member; and coupling means. Preferably, these three portions of the ejector mechanism have generally plate-shaped configurations and are arranged in a side-by-side stacked relationship with the coupling means sandwiched between the actuating member and the receiving/ejection member and pivotally connected to a second housing wall transverse to the first housing wall.

The receiving/ejection member is movably supported within the chamber and is engageable by the PCMCIA card and drivable thereby toward the electrical connector structure to a connection position in which the PCMCIA card is operatively coupled to the electrical connector structure. From its connection position the receiving/ejection member is drivable away from the electrical connector structure toward the insertion slot to an ejection position to engage the PCMCIA card and uncouple it from the electrical connector structure. The actuating member is carried by the housing and is manually movable, from the exterior of the housing, between connection and ejection positions.

The coupling means interconnect the actuating member and the receiving/ejection member for conjoint movement between the connection and ejection positions thereof. In response to a manual force exerted on the actuating member to move it from its connection position to its ejection position, the coupling means operate to transmit a substantially greater force to the receiving/ejection member in a direction urging it from its connection position toward its ejection position.

DETAILED DESCRIPTION

Figure 1:
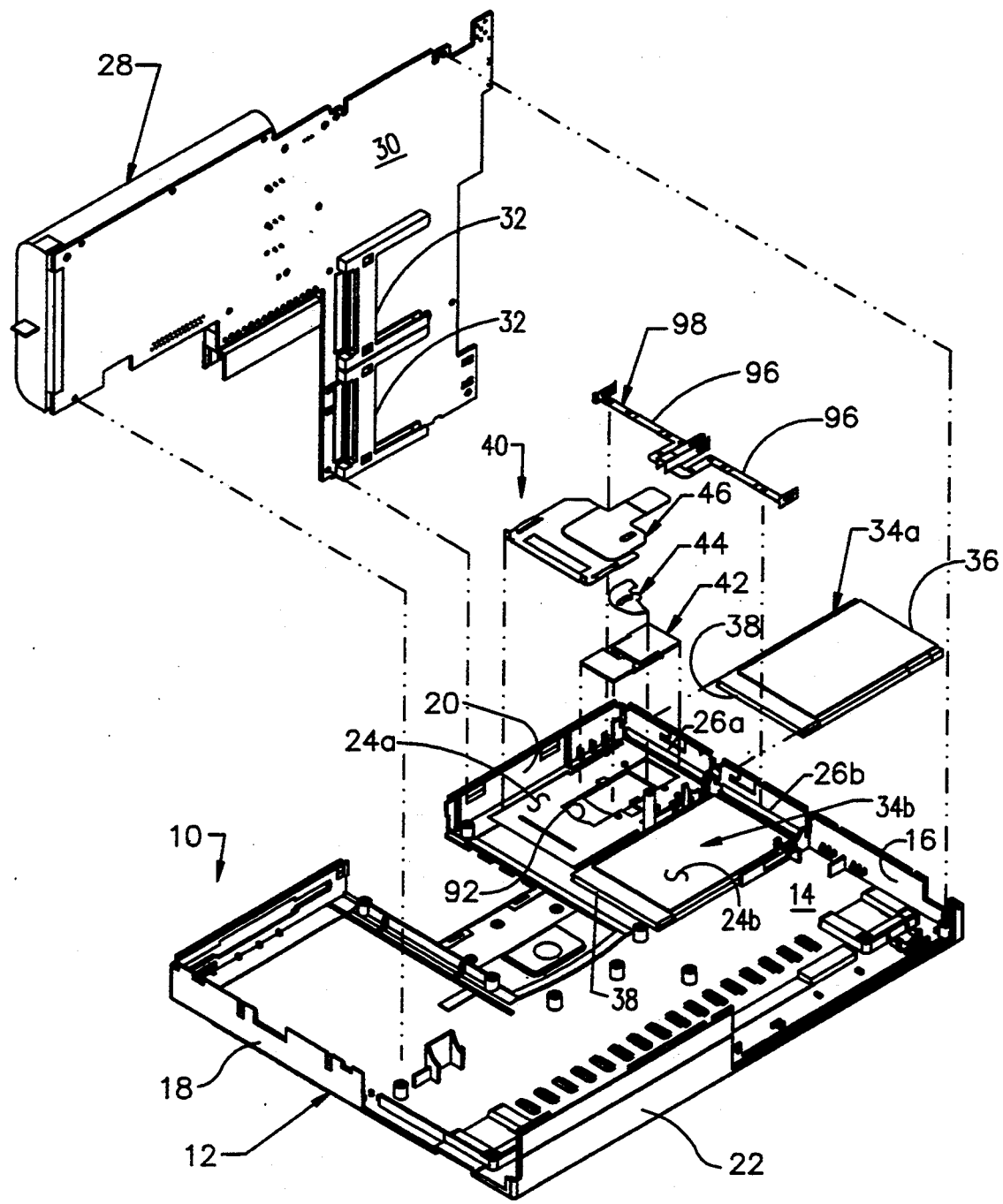
FIG. 1 is a partially exploded perspective view of a bottom portion of a representative notebook computer incorporating therein a specially designed mechanically leveraged PCMCIA card ejector mechanism embodying principles of the present invention.

Illustrated in FIG. 1 in partially exploded form is a portion of a notebook computer 10 embodying principles of the present invention. The computer 10 includes a generally rectangular plastic housing 12 having a bottom wall 14, and opposing side wall pairs 16,18 and 20,22 projecting upwardly from the periphery thereof. For purposes of illustration the top side components of the notebook computer (i.e., its keyboard and pivotable lid/display screen structure) have been removed.

A side-by-side pair of internal PCMCIA card chambers 24a,24b are disposed within the housing 12 adjacent its vertical side wall 16, are partially bounded by the bottom housing wall 14, and respectively open outwardly through a pair of horizontally elongated rectangular insertion slots 26a,26b formed in the housing side wall 16. A main system planar board 28 having a bottom side 30 is suitably supported within the housing 12 in an upwardly spaced, parallel relationship with the bottom wall 14 and forms a top side boundary for the internal chambers 24a,24b. Carried on the bottom side 30 of the planar board 28 are a pair of conventional PCMCIA pin type electrical connector structures 32. With the planar board 28 operatively mounted in the housing 12 the electrical connector structures 32 are spaced inwardly apart from the insertion slots 26a,26b in a facing relationship therewith.

The internal chambers 24a,24b are configured to respectively receive a pair of PCMCIA cards 34a,34b removably inserted into the chambers through the side wall slots 26a,26b. In FIG. 1 the card 34a is shown removed from its associated chamber 24a, and the card 34b is shown operatively inserted into its associated chamber 24b. Each PCMCIA card has a relatively thin, elongated rectangular configuration, an outer end 36, and a socketed inner end 38. When the PCMCIA cards 34a,34b are operatively inserted into their associated chambers 24a,24b through the side wall slots 26a,26b the socketed card ends 38 are forcibly plugged into the planar board pin connectors 32, thereby operatively coupling the inserted cards to the planar board.

Operatively associated with each of the internal chambers 24a,24b is a specially designed, mechanically leveraged card ejector mechanism 40 embodying principles of the present invention. In a manner subsequently described, the ejector mechanisms 40 facilitate the uncoupling of the inserted PCMCIA cards 34a,34b from the electrical connector structures 32 and the removal of the uncoupled cards from the internal chambers 24a,24b through their associated side wall insertion slots 26a,26b.

According to a key feature of the present invention, each of the mechanically leveraged PCMCIA ejector mechanisms 40 is uniquely configured and positioned to be disposed beneath and essentially entirely within the peripheral footprint of its associated PCMCIA card when the card is operatively inserted into its internal housing chamber. Additionally, each of the ejector mechanisms 40 is of a quite simple and relatively inexpensive design, and may be easily and quickly installed in the notebook computer 10 or in another type of computer.

Referring now to FIGS. 1 and 4–6, each ejector mechanism 40 basically comprises three simple components—a manually operable molded plastic actuating plate 42, coupling means in the form of a sheet metal lever plate 44, and a sheet metal receiving/ejection plate 46. The actuating plate 42 (FIG. 4) has an elongated rectangular configuration, an inner end 48, an outer end 50, and a top side surface 52. A generally U-shaped recess 54 is formed in the top side surface 52 and has facing inner and outer side edges 56 and 58, with side edge 56 having an outwardly projecting convexly curved portion 56a. Relatively narrow leg portions 54a of the top side recess 54 extend toward the plate end 50 and terminate in a pair of stop surfaces 60.

The lever plate 44 (FIG. 5) has a generally arcuate shape, an inner end 62 with a downwardly projecting tab 64, an outer end 66 with a downwardly projecting tab 68, and an intermediate portion 70 disposed between the inner and outer ends 62 and 66. An arcuate slot 72 is formed in the intermediate plate portion 70, and the intermediate portion 70 has a curved projecting edge portion 74 on the tab side of the lever plate 44.

The receiving/ejection plate 46 has a generally rectangular body portion 76 with opposed inner and outer side edges 78 and 80. A pair of upturned engagement tabs 79 are formed along the inner side edge 78 at opposite corners of the body portion 76, and a reduced width tongue portion 82 projects outwardly from a central portion of the side edge 80. A generally straight slot 84 is formed through the body portion 76 to one side of the tongue 82, and a downwardly projecting tab 86 is formed on the side edge 80 along the slot side thereof.

Referring now to FIGS. 2, 3A, 3B and 7, for purposes later described herein a small depression 88 is formed in the top side of the bottom housing wall 14 in each of the internal card chambers 24a,24b. Additionally, small upwardly projecting cylindrical bosses or pins 90 project upwardly from the top side of the bottom housing wall 14 in each of the chambers in spaced apart relationships with the depressions 88. The actuating plates 42 are captively retained in a pair of rectangular openings 92 formed in the bottom housing wall 14 and are manually slidable relative to the wall 14 toward the insertion slots 26 to receiving/ejection positions, and away from the insertion slots 26 to connection positions.

Figure 2:
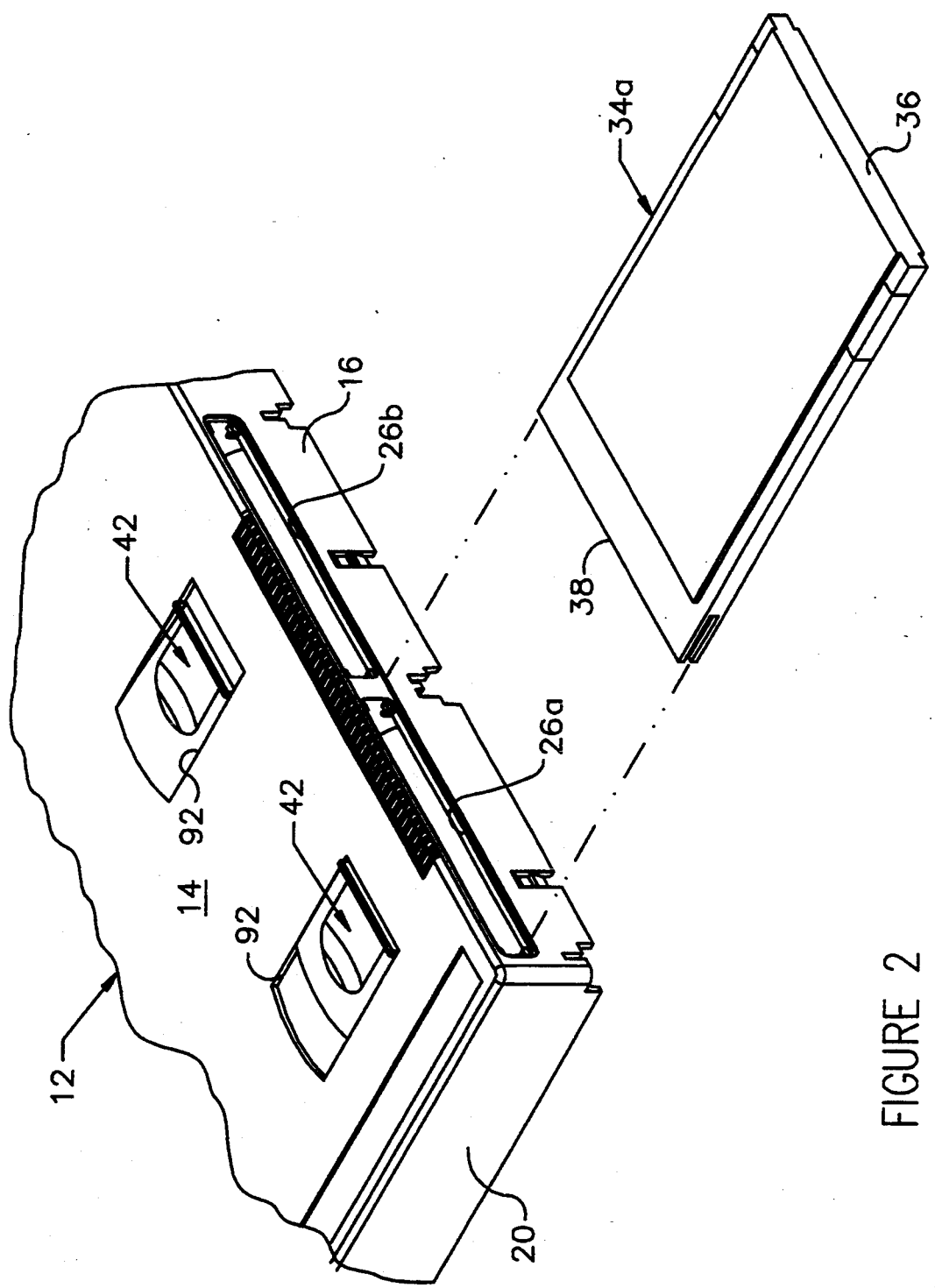
FIG. 2 is an enlarged scale bottom side perspective view of a corner portion of the computer.
Figure 3A:
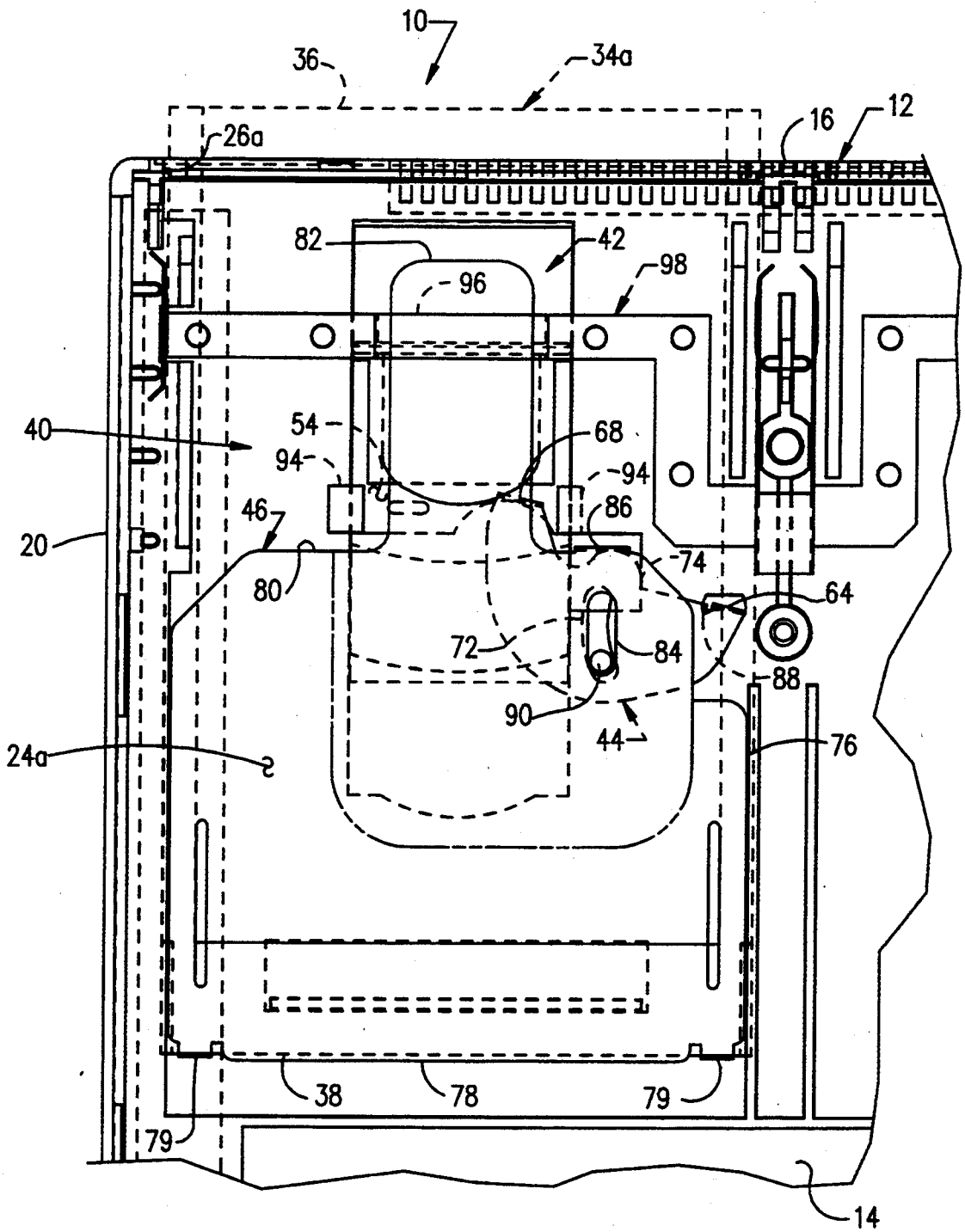
FIG. 3A is an enlarged scale top plan view of the ejector mechanism in its extended card receiving/ejection position.
Figure 3B:
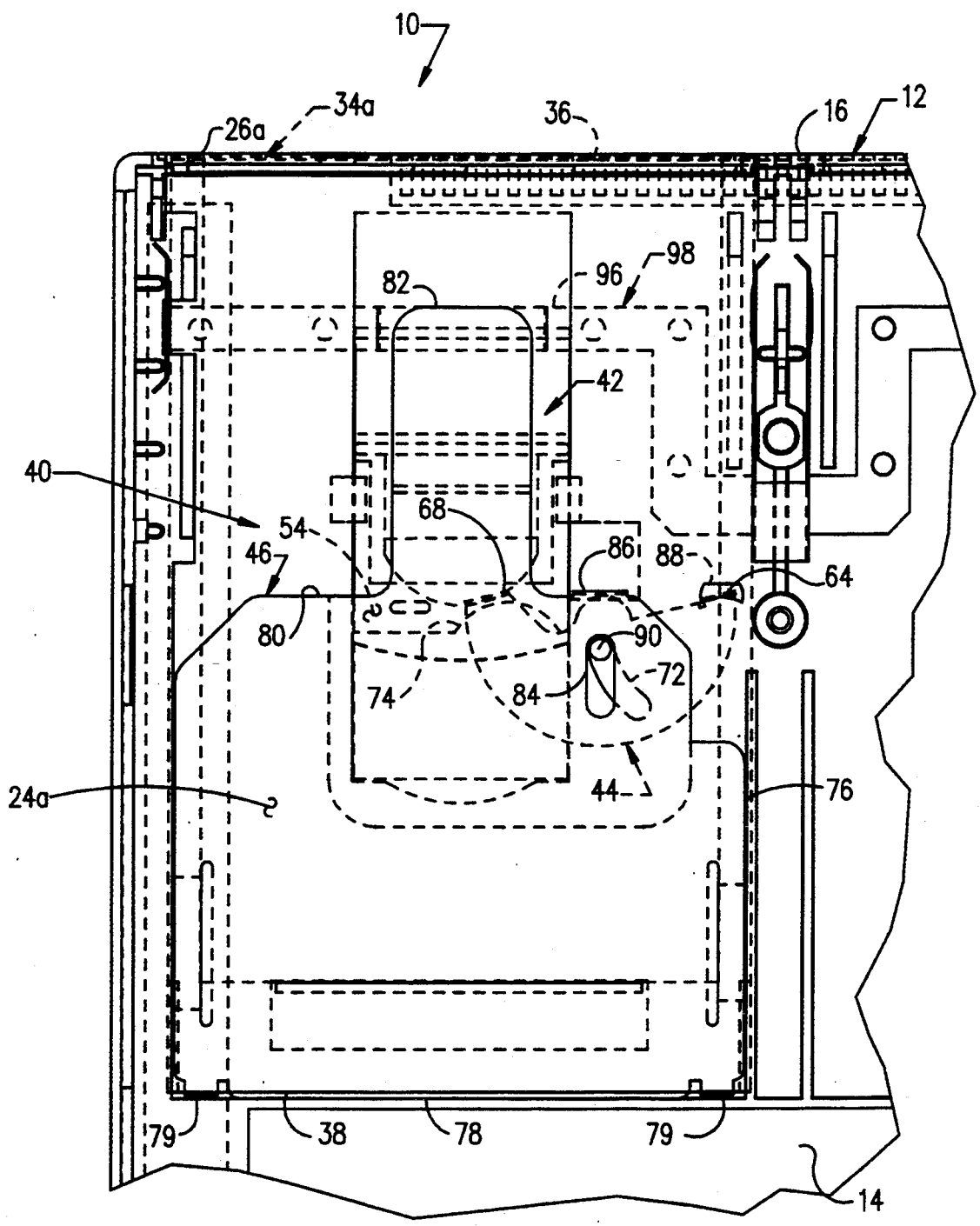
FIG. 3B is an enlarged scale top plan view of the ejector mechanism in its retracted card connection position.
Figure 4:
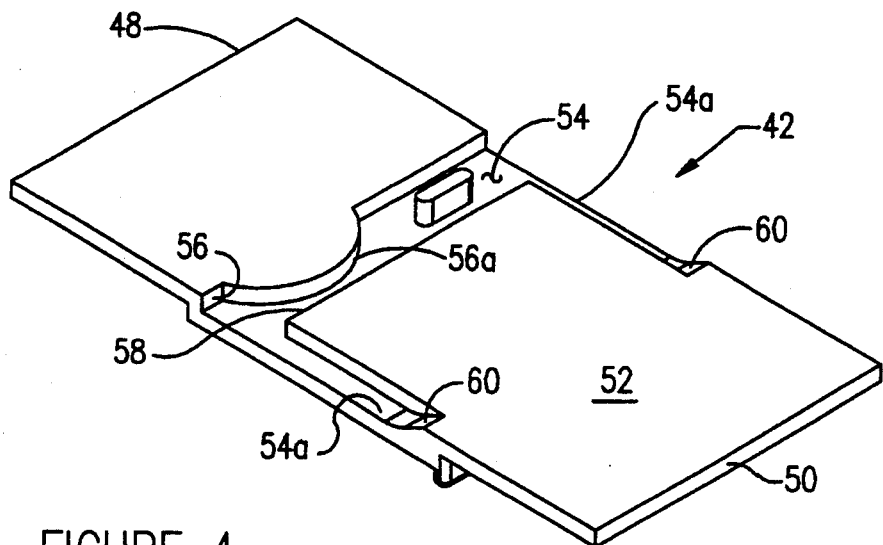
FIG. 4 is an enlarged scale top side perspective view of a manually operable actuating plate portion of the ejector mechanism slidably mounted externally on the computer housing and used to actuate the ejector mechanism.
Figure 5:
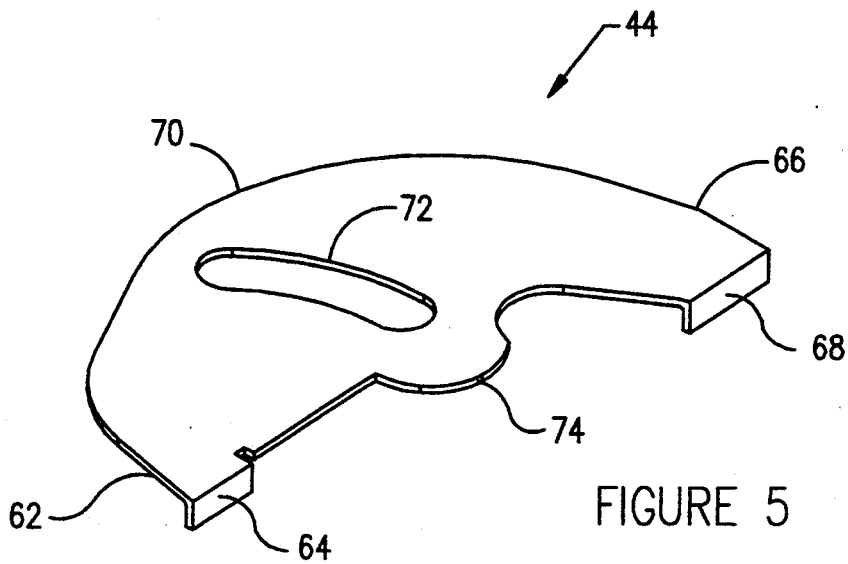
FIG. 5 is an enlarged scale top side perspective view of a lever plate portion of the ejector mechanism.
Figure 6:
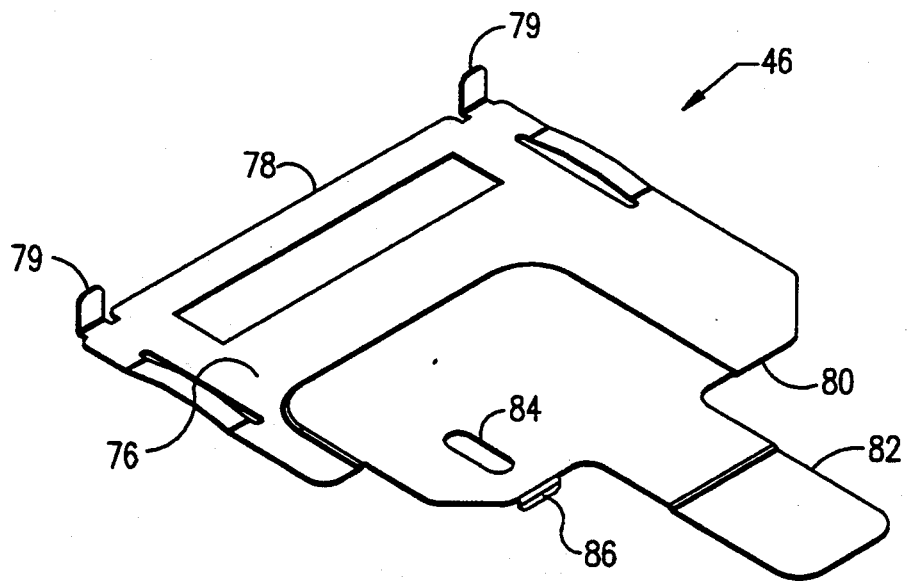
FIG. 6 is an enlarged scale top side perspective view of a receiving/ejection plate portion of the ejector mechanism.
Figure 7:
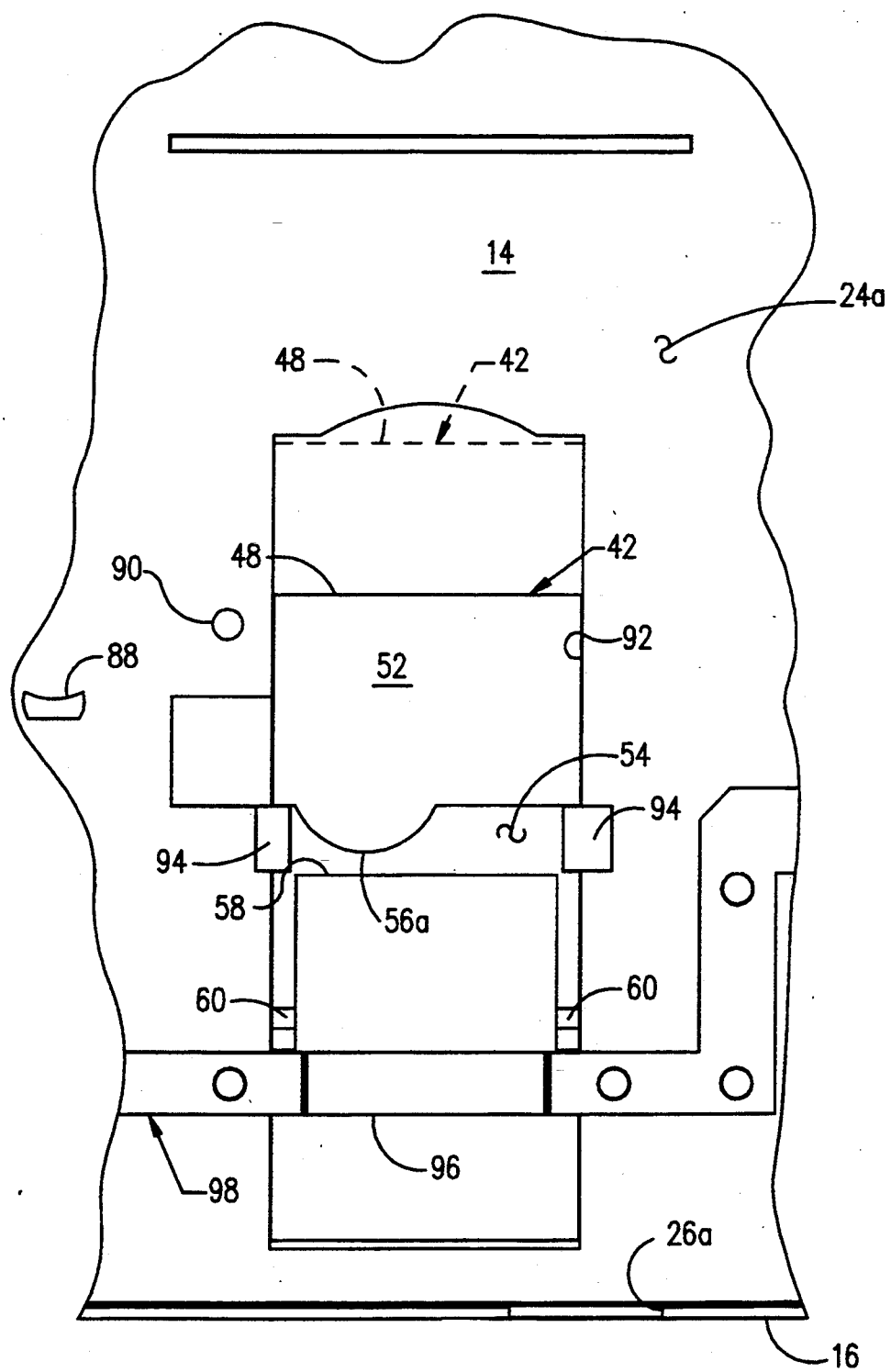
FIG. 7 is an enlarged scale top plan view of one of the two illustrated PCMCIA card chamber portions of the computer, with the lever plate and receiving/ejection plate portions of its associated ejector mechanism having been removed for illustrative purposes.

The actuating plate 42 on the left in FIG. 2 is shown in its receiving/ejection position, while the actuating plate 42 on the right in FIG. 2 is shown in its connection position. FIG. 3A shows one of the actuating plates 42 in its receiving/ejection position, and FIG. 3B shows the actuating plate in its connection position. The actuating plate 42 shown in FIG. 7 is shown in solid line in its receiving/ejection position, and in dotted line in its slidingly shifted connection position.

The top side surfaces 52 of the installed actuating plates 42 are exposed to the interiors of the card chambers 24a,24b. Within each of the chambers 24a,24b an opposed pair of rectangular stop portions 94 are formed on the top side of the bottom housing wall 14, inwardly overlie the plate opening 92, and are received in the actuating plate top side recess 54. When the actuating plate 42 is manually moved to its receiving/ejection position the stop portions 94 engage the plate member recess edge 56 and prevent further movement of the actuating plate 42 toward its associated insertion slot 26a,24b. When the actuating plate 42 is manually moved to its connection position the stop portions 94 engage the plate member stop surfaces 60 and prevent the actuating plate 42 from being moved further away from its associated insertion slot 26a,26b.

Referring now to FIGS. 1 and 3A, with the system planar board 28 not yet in place within the computer housing 12 the balance of each of the mechanically leveraged card ejector mechanisms 40 (using the ejector mechanism in the chamber 24a as an example) is easily and rapidly installed in the following manner. First, the lever plate 44 is positioned against the top side of the bottom housing wall 14 with the tab side of the lever plate facing the insertion slot 24a; the lever plate tab 68 downwardly received in the actuating plate top side recess 54 in opposition with the curved side edge portion 74 thereof; the boss 90 extending upwardly through the lever plate arcuate slot 72; and the lever plate tab 64 downwardly received in the bottom housing wall recess 88. This permits the installed lever plate 44 to pivotally driven along the bottom housing wall 14, about the lever plate inner end tab 64, between a receiving/ejection position (FIG. 3A) and a connection position (FIG. 3B), with the pivotal arc of the lever plate being limited by the pin 90 and the ends of the arcuate lever plate slot 72.

Next, with its inner side edge tabs 79 facing upwardly and its tongue portion 82 facing the insertion slot 24a the receiving/ejection plate 46 is placed within the chamber 24a in a parallel relationship with the bottom housing wall 14, with the lever plate 44 slidingly being sandwiched between the receiving/ejection plate 46 and the bottom housing wall 14. The receiving/ejection plate 46 is installed in its operative orientation by placing its projecting tongue 82 beneath a raised portion 96 of a metal hold-down strap structure 98 secured to the top side of the bottom housing wall 14; positioning the plate slot 84 so that an upper end portion of the pin 90 extends upwardly therethrough; and positioning the downwardly projecting plate tab 86 in a downwardly overlapping relationship with the curved intermediate side edge portion 74 of the lever plate 44. After installation of the lever and receiving/ejection plate portions of the ejector mechanisms 40 the system planar board is secured in place over the chambers 24a,24b.

With the receiving/ejection plate 46 installed in this manner it is slidably supported within the internal chamber 24a for driven movement toward the insertion slot 26a to a receiving/ejection position shown in FIG. 3A, and driven movement away from the insertion slot 26a to a connection position shown in FIG. 3B. The lever member 46 functions to couple the actuating plate 42 and the receiving/ejection plate 46 for conjoint movement between their receiving/ejection positions (FIG. 3A) and their connection positions (FIG. 3B).

The operation of one of the two identical mechanically leveraged card ejector mechanisms 40 (representatively the one in the internal chamber 24a) will now be described beginning with FIG. 3A in which, as previously mentioned, the plates 42,44 and 46 are in their receiving/ejection positions. As the PCMCIA card 34a is being operatively inserted through the side wall slot 24a the inner card end 38 slides along the top side of the receiving/ejection plate 46 until the inner card end 38 engages the upstanding inner end tabs 79 on the plate 46. Further insertion of the PCMCIA card 34a to its operatively installed position (shown in FIG. 3B) drives the receiving/ejection plate 46 to its connection position (also shown in FIG. 3B) in which the now fully inserted card 34a is operatively coupled to its associated electrical connector portion 32 on the system planar board 28 (see FIG. 1).

As may be seen by comparing FIGS. 3A and 3B, this card-driven movement of the receiving/ejection plate 46 to its connection position correspondingly drives the actuating plate 42 from its receiving/ejection position (FIG. 3A) to its connection position (FIG. 3B) via the lever plate 46 which drivingly interconnects the plates 46 and 42 above and below it. More specifically, as the PCMCIA card 34a drives the receiving/ejection plate 46 toward its connection position, the downwardly projecting tab 86 on the plate 46 engages the curved projecting side edge portion 74 on the lever plate 44 and pivotally drives the lever plate 44 in a counterclockwise direction about its downwardly projecting inner end tab 64. As the lever plate 44 is being pivotally driven in this manner its downwardly projecting outer end tab 68 forcibly engages the curved actuating plate recess side surface 74 and drives the actuating plate 42 to its connection position shown in FIG. 3B.

When it is subsequently desired to disconnect and eject the inserted PCMCIA card 34a, the actuating plate 42 is manually moved from its FIG. 3B connection position back to its initial FIG. 3A receiving/ejection position. Via the lever plate 44 this manual actuating force operates to also drive the receiving/ejection plate 46 back to its FIG. 3A receiving/ejection position. As the plate 46 is being drivingly returned to this initial position thereof, its upstanding inner end tabs 79 engage the inner end 38 of the PCMCIA card 34a, forcibly uncouple it from its associated electrical connector structure 32, and drive an outer end portion of the card 34a outwardly through the side wall slot 26a, whereupon this outwardly projecting card end portion may be manually grasped to complete the removal of the uncoupled card from the computer 10.

According to a key feature of the present invention the ejection force exerted on the PCMCIA card 34a by the receiving/ejection plate 46 is substantially amplified relative to the manual card ejection force exerted on the actuating plate 42. As the actuating plate 42 is being manually driven from its FIG. 3B position toward its FIG. 3A position the curved recess side edge portion 74 of the actuating plate 42 forcibly engages the outer end tab 68 of the lever plate 44 and pivots the lever plate in a clockwise direction. This clockwise pivoting of the lever plate 44 causes its curved intermediate side edge portion 74 to forcibly engage the downwardly projecting tab 86 on the receiving/ejection plate 46, thereby driving the plate 46 from its FIG. 3B connection position to its FIG. 3A receiving/ejection position.

The desirable amplification of the manual ejection force transmitted to the receiving/ejection plate 46 through the lever plate 44 occurs due to the fact that the manual actuating plate force acts on the lever plate through a driven moment arm length on the lever plate generally equal to the distance between the downwardly projecting lever plate tabs 64 and 68, while the corresponding driving lever plate moment arm length used to forcibly translate the plate 46 back to its receiving/ejection position is considerably shorter, being generally equal to the distance between the downwardly projecting lever plate inner end tab 64 and the curved intermediate side edge portion 74 of the lever plate that drivingly engages the downwardly projecting tab portion 86 of the receiving/ejection plate 46.

In summary, with either of the PCMCIA cards 34 operatively inserted into its associated internal housing chamber 24 the associated card ejector mechanism is very compactly disposed beneath and essentially entirely within the peripheral footprint of the inserted card. Due to their previously described amplification of their manually exerted ejection forces the mechanically leveraged card ejector mechanisms substantially reduce the magnitude of such manual forces required to uncouple and eject the PCMCIA cards from the computer. As can also be seen from the foregoing description, each of the two illustrated ejector mechanisms is relatively inexpensive to manufacture, and may be rapidly and quite easily installed in a computer.

The foregoing detailed description is to be clearly understood as being given by way of illustration and example only, the spirit and scope of the present invention being limited solely by the appended claims.

What is claimed is:

1. A computer comprising:
   a housing having a first exterior wall with a slot therein, and an internal chamber opening outwardly through said slot and configured to receive a computer card removably inserted therein through said slot;
   an electrical connector structure disposed within said housing and positioned to be operatively coupled to the computer card in response to the insertion of the card into said chamber; and
   a mechanically leveraged ejector mechanism operative to facilitate the uncoupling of the inserted computer card from said electrical connector structure and the removal of the uncoupled card from said chamber through said slot, said ejector mechanism being positioned and configured to be disposed essentially entirely within the peripheral footprint of the inserted computer card and including:
      a receiving/ejection member movably supported within said chamber, said receiving/ejection member being engageable by the computer card and drivable thereby toward said electrical connector structure to a connection position in which the computer card is operatively coupled to said electrical connector structure, and drivable away from said connection position to an ejection position to engage and uncouple the computer card from said electrical connector structure,
      an actuating member carried by said housing and being manually movable, from the exterior of said housing, between connection and ejection positions, and
      coupling means for interconnecting said actuating member and said receiving/ejection member for conjoint movement between said connection and ejection positions thereof,
         said coupling means, responsive to a manual force exerted on said actuating member to move said actuating member from said connection position thereof toward said ejection position thereof, operating to transmit a force greater than said manual force to said receiving/ejection member in a direction urging said receiving/ejection member from said connection position toward said ejection position.

2. The computer of claim 1 wherein:
   said housing has a second exterior wall extending transversely to said first exterior wall and partially bounding said internal chamber, and
   said actuating member is slidably carried on said second exterior wall.

3. The computer of claim 2 wherein:
   said second exterior wall is a bottom wall of said housing.

4. The computer of claim 1 wherein:
   said receiving/ejection member is generally plate-shaped and is slidably carried within said internal chamber.

5. The computer of claim 4 wherein:
   said housing has a second exterior wall extending transversely to said first exterior wall and partially bounding said internal chamber,
   said receiving/ejection member inwardly overlies said second exterior wall in a parallel relationship therewith, and
   said coupling means include a generally plate-shaped lever member pivotally connected to said second exterior wall, sandwiched between said second exterior wall and said receiving/ejection member, and drivingly interconnecting said receiving/ejection member and said actuating member.

6. The computer of claim 1 wherein said computer is a notebook computer.

7. The computer of claim 1 wherein:
   said computer further comprises a main system planar board operatively disposed in said housing, and
   said electrical connector is carried on said main system planar board.

8. A computer comprising:
   a housing having an exterior side wall portion with a slot therein, an internal chamber opening outwardly through said slot and configured to receive a computer card removably inserted therein through said slot, and a bottom exterior wall portion extending transversely to said exterior side wall portion and partially bounding said internal chamber;
   an electrical connector structure disposed within said housing and positioned to be operatively engaged by the computer card in response to the insertion of the card into said internal chamber; and
   manually operable card ejector means for disengaging the inserted computer card from said electrical connector, said card ejector means including:
      an actuating member carried by said bottom exterior wall portion and being manually slidable relative thereto toward and away from said slot, said actuating member having an inner side exposed to the interior of said chamber,
      a receiving/ejection plate member disposed within said internal chamber, in a closely adjacent, parallel relationship with said bottom exterior wall portion, said receiving/ejection plate member inwardly overlying said inner side portion of said actuating member and being supported for sliding movement toward and away from said slot, said receiving/ejection plate member being engageable by the computer card and drivable thereby toward said electrical connection structure, and operative, when driven toward said slot, to forcibly engage the inserted computer card and disengage it from said electrical connector structure, and a lever plate member pivotally connected to said bottom exterior wall portion and interconnecting said actuating and receiving/ejection plate members for conjoint movement toward and away from said slot, said lever plate member being operative to transmit to and amplify a manual card ejection force exerted on said actuating member.

9. The computer of claim 8 wherein:
said manually operable card ejector means are positioned and configured to underlie and be disposed essentially within the peripheral footprint of the inserted computer card.

10. The computer of claim 8 wherein said computer is a notebook computer.

11. The computer of claim 8 wherein:
said bottom exterior wall portion of said housing has an inner side with a depression therein, and
said lever plate member has a downwardly projecting tab thereon, said tab being received in said depression and said lever plate member being pivotable about said tab relative to said bottom exterior wall portion of said housing.

12. The computer of claim 8 wherein:
said receiving/ejection plate member has an inner end with opposite corner portions, and a pair of drive tab members projecting upwardly from said corner portions.

13. The computer of claim 8 wherein:
said lever plate member has an inner end pivotally connected to said bottom exterior wall portion of said housing, and an outer end having a downwardly projecting tab thereon, and
said inner side portion of said actuating member has a depression formed thereon and receiving said downwardly projecting tab.

14. The computer of claim 13 wherein:
said depression has a curved side surface portion drivingly engageable with said tab in response to manual movement of said actuating member toward said slot.

15. The computer of claim 8 wherein:
said lever plate member has an inner end pivotally connected to said bottom exterior wall portion of said housing, an outer end connected to said actuating member, an intermediate portion disposed between said inner and outer ends, and an arcuate first slot formed in said intermediate portion,
said receiving/ejection plate member has a generally straight second slot formed therein and overlying said first slot, and
said bottom housing wall portion has an inner side surface from which a boss upwardly projects through said first and second slots.

16. The computer of claim 8 wherein:
said lever plate member has an inner end pivotally connected to said bottom exterior wall portion of said housing, an outer end connected to said actuating member, and an intermediate portion positioned between said inner and outer ends, said intermediate portion having a curved side edge section projecting toward said slot, and
said receiving/ejection plate member has a downwardly projecting tab portion drivingly engageable with said curved side edge section in response to driven movement of said receiving/ejection plate member away from said slot.

17. The computer of claim 8 wherein:
said receiving/ejection plate member has a tongue portion extending toward said slot, and
said computer further comprises a hold-down member secured to said bottom exterior wall portion, extending over said tongue portion and slidingly engaging the top side thereof.

18. For use in conjunction with a computer having an exterior housing side wall with a computer insertion slot formed therein, an internal computer card chamber opening outwardly through said insertion slot and being downwardly bounded by a bottom housing wall, a mechanically leveraged computer card ejector mechanism configured to underlie and be disposed essentially within the peripheral footprint of a computer card inserted into said internal chamber, said computer card ejector mechanism comprising:

an actuating member slidably carried by said bottom housing wall for manual movement relative thereto toward and away from said insertion slot, said actuating member having an upper side surface exposed to the interior of said chamber and having a depression formed therein;

a depression formed in the inner side surface of said bottom housing wall;

a receiving/ejection plate member disposed within said chamber, in a closely adjacent, parallel relationship with said bottom housing wall, said receiving/ejection plate member inwardly overlying said upper side surface of said actuating member and being supported for sliding movement toward and away from said insertion slot, said receiving/ejection plate member having a generally straight first slot formed therein, and a downwardly projecting tab portion, said receiving/ejection plate member being engageable by the computer card and drivable thereby away from said insertion slot, and operative, when driven toward said insertion slot, to engage the computer card and move an end portion thereof outwardly through said insertion slot;

a lever plate member sandwiched between said bottom housing wall and said receiving/ejection plate member and pivotally connected to said bottom housing wall, said lever plate member interconnecting said actuating and receiving/ejection plate members for conjoint movement toward and away from said insertion slot and being operative to transmit to and amplify a manual ejection force exerted on said actuating member and directed toward said insertion slot, said lever plate member having an inner end with a downwardly projecting tab disposed thereon and received in said bottom housing wall depression, an outer end with a downwardly projecting tab disposed thereon and received in said actuating member depression, an intermediate portion disposed between said inner and outer ends and having a side edge portion extending toward said insertion slot and engageable with said receiving/ejection plate member tab portion, and an arcuate second slot formed in said intermediate portion and underlying said first slot in said receiving/ejection plate member; and a boss member projecting upwardly from the inner side of said bottom housing wall and received in said first and second slots.

* * * * *